United States Patent
Jung et al.

(10) Patent No.: US 9,893,125 B2
(45) Date of Patent: Feb. 13, 2018

(54) ORGANIC LIGHT EMITTING DIODE DISPLAY DEVICE INCLUDING OVERLAPPING COLOR FILTERS

(71) Applicant: LG Display Co., Ltd., Seoul (KR)

(72) Inventors: Ki Young Jung, Paju-si (KR); Sung Min Ko, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 7 days.

(21) Appl. No.: 14/793,563

(22) Filed: Jul. 7, 2015

(65) Prior Publication Data

US 2016/0099293 A1    Apr. 7, 2016

(30) Foreign Application Priority Data

Oct. 7, 2014  (KR) .......................... 10-2014-0135168

(51) Int. Cl.
  *H01L 27/32*  (2006.01)

(52) U.S. Cl.
  CPC ........ *H01L 27/3213* (2013.01); *H01L 27/322* (2013.01)

(58) Field of Classification Search
  None
  See application file for complete search history.

(56) References Cited

U.S. PATENT DOCUMENTS

| 2003/0107314 A1 | 6/2003 | Urabe et al. |
| 2007/0123135 A1* | 5/2007 | Yang .................... H01L 27/3213 445/24 |
| 2012/0200555 A1 | 8/2012 | Omoto |
| 2013/0334507 A1* | 12/2013 | Shimoji .................... F21V 9/08 257/40 |

FOREIGN PATENT DOCUMENTS

| CN | 1976053 A | 6/2007 |
| CN | 102629448 | 8/2012 |

OTHER PUBLICATIONS

Office Action for Chinese Patent Application No. CN 201510477029.3, Dec. 11, 2017, 14 pages (With English Translation).

* cited by examiner

*Primary Examiner* — Jay C Chang
(74) *Attorney, Agent, or Firm* — Fenwick & West LLP

(57) ABSTRACT

Disclosed is an organic light emitting diode (OLED) display device for preventing a dark spot (dead pixel). The OLED display device includes a white OLED disposed in each of a plurality of pixels, a driving circuit unit disposed in each of the plurality of pixels, a first color filter disposed between the white OLED and the driving circuit unit, and a second color filter or a third color filter configured to overlap the first color filter between the white OLED and the driving circuit unit.

16 Claims, 5 Drawing Sheets

ORGANIC LIGHT EMITTING DIODE DISPLAY DEVICE INCLUDING OVERLAPPING COLOR FILTERS

CROSS-REFERENCE TO RELATED APPLICATIONS

This application claims the benefit of the Korean Patent Application No. 10-2014-0135168 filed on Oct. 7, 2014, which is hereby incorporated by reference as if fully set forth herein.

BACKGROUND

Field of the Invention

The present invention relates to an organic light emitting diode (OLED) display device, and more particularly, to an OLED display device for preventing a dark spot on the display device (i.e. a dead pixel).

Discussion of the Related Art

Recently, an OLED display device including an OLED is applied to televisions (TVs), monitors, mobile information devices, etc.

The OLED display device includes an OLED, which is configured with a white OLED (WOLED), and a plurality of color filters for realizing red (R), green (G), and blue (B). Also, a color filter on thin film transistor (COT) structure has been proposed where the plurality of color filters are disposed on a lower array substrate.

Figure 1:
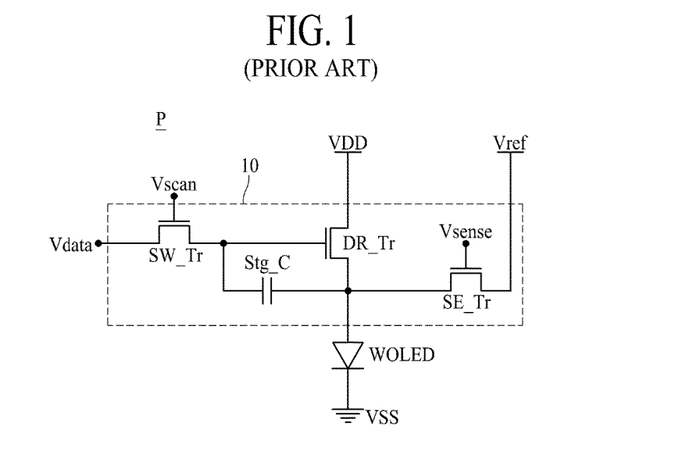
FIG. 1 is a circuit diagram of one pixel configuring a related art OLED display device.
Figure 2:
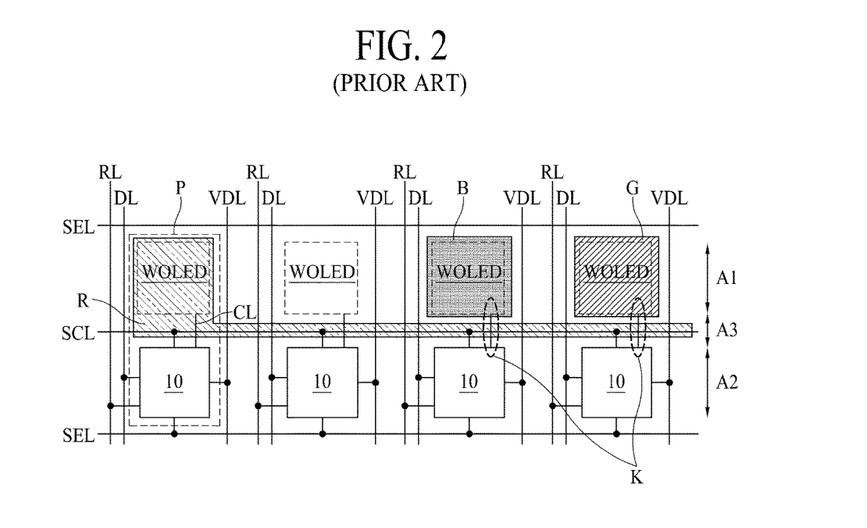
FIG. 2 is a plan view of an OLED display device having a COT structure.

FIG. 1 is a circuit diagram of one pixel configuring a related art OLED display device. FIG. 2 is a plan view of an OLED display device having a COT structure.

Referring to FIG. 1, a pixel area P configuring the related art OLED display device includes a white OLED WOLED and a driving circuit unit 10 that drives the white OLED WOLED. The driving circuit unit 10 includes a switching thin film transistor (TFT) SW_Tr, a driving TFT DR_Tr, a sensing TFT SE_Tr, a capacitor Stg_C, and the white OLED WOLED.

The switching TFT SW_Tr is turned on according to a gate signal supplied through a scan line SCL and supplies a data voltage Vdata, supplied through a data line DL, to the driving TFT DR_Tr.

The driving TFT DR_Tr is turned on according to the data voltage Vdata supplied from the switching TFT SW_Tr, generates a data current from power VDD supplied through a power line VDL, and supplies the data current to the white OLED WOLED.

The sensing TFT SE_Tr is for sensing a threshold voltage deviation of the driving TFT DR_Tr that causes a degradation of image quality, and the threshold voltage deviation is sensed in a sensing mode. The sensing TFT SE_Tr supplies, as a sensing voltage Vref, a current of the driving TFT DR_Tr to a reference line RL in response to a sensing control signal Vsense supplied through a sensing line SEL.

The capacitor Stg_C holds the data voltage Vdata supplied to the driving TFT DR_Tr during one frame. To this end, the capacitor Stg_C is connected to a gate terminal and a source terminal of the driving TFT DR_Tr.

The white OLED WOLED emits light according to the data current supplied from the driving TFT DR_Tr.

The pixel area P includes the switching TFT SW_Tr, the driving TFT DR_Tr, the sensing TFT SE_Tr, the capacitor Stg_C, and the white OLED WOLED.

Referring to FIG. 2, the OLED display device having the COT structure includes a plurality of pixel areas P which are arranged as follows. Each of the plurality of pixel areas P includes a first area A1, which is disposed at one side (an upper side) of a corresponding pixel area P with respect to the scan line SCL crossing a space between adjacent sensing lines SEL, and a second area A2 which is disposed at the other side (a lower side). The first area A1 and the second area A2 are disposed between the adjacent sensing lines SEL. The white OLED WOLED is disposed in the first area A1, and the driving circuit unit 10 is disposed in the second area A2.

The driving circuit unit 10 is connected to the scan line SCL, the sensing line SEL, the data line DL, and the power line VDL which are adjacent thereto. The driving circuit unit 10 supplies the data current of the driving TFT DR_Tr to the white OLED WOLED through a connection line CL which is disposed in a third area A3 between the first area A1 and the second area A2.

The pixel area P includes a red pixel area P, a white pixel area P, a blue pixel area P, and a green pixel area P. The red pixel area P, the white pixel area P, the blue pixel area P, and the green pixel area P, as illustrated in FIG. 2, are disposed in order in first to fourth columns. In this case, a red color filter R is disposed in the red pixel area P, a blue color filter B is disposed in the blue pixel area P, and a green color filter G is disposed in the green pixel area P. Here, the red color filter R is disposed in the third area A3 where the scan line SCL is formed, in addition to the red pixel area P. The red color filter R disposed in the third area A3 prevents light from being leaked from a corresponding pixel area P.

Figure 3:
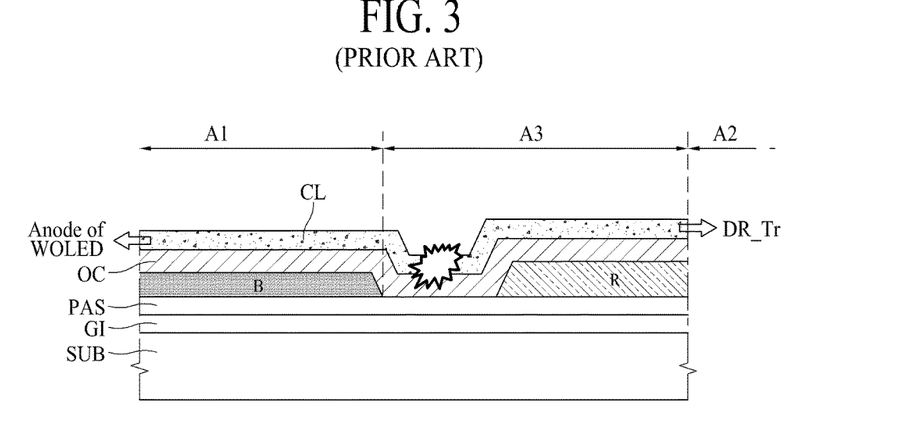
FIG. 3 is a cross-sectional view of an area K illustrated in FIG. 2.

FIG. 3 is a cross-sectional view of an area K illustrated in FIG. 2 and illustrates the third area A3 where a connection electrode CL is formed in the blue pixel area P. For reference, for convenience of a description, the scan line SCL is not illustrated in FIG. 3.

Referring to FIG. 3, in the blue pixel area P, the blue color filter B is disposed in the first area A1, and the red color filter R is disposed in the third area A3 which is separated by a specific interval from the blue color filter B. An overcoat layer OC and the connection electrode CL are stacked on the blue color filter B and the red color filter R. The connection electrode CL connects the driving TFT DR_Tr to an anode of the white OLED WOLED.

A method of manufacturing the OLED display device includes a plurality of thermal processes which are subsequent processes performed after a process of depositing a color filter. However, pigments of the red, green, and blue color filters R, G and B differ, and thus, the plurality of thermal processes have a difference in degree of thermal expansion. For this reason, in the related art OLED display device, since the blue color filter B is separated from the red color filter R in the third area A3, the connection electrode CL which is stacked on the blue color filter B and the red color filter R is broken. This is because the red, green, and blue color filters R, G and B are differently and repeatedly contracted and expanded in a thermal process after the red, green, and blue color filters R, G and B are deposited.

As described above, a problem where the connection electrode CL is broken occurs in the blue pixel area P and the red pixel area P and becomes a cause of a dark spot on the display (i.e. dead pixel).

In reference labels which are not described in FIG. 3, SUB refers to a substrate, GI refers to a gate insulation layer, and PAS refers to a passivation layer.

SUMMARY

Accordingly, the present invention is directed to provide an OLED display device that substantially obviates one or more problems due to limitations and disadvantages of the related art.

An aspect of the present invention is directed to provide an OLED display device for preventing a dark spot.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting diode (OLED) display device including: a plurality of pixels disposed on a substrate; a white OLED disposed in each of the plurality of pixels; a driving circuit unit disposed in each of the plurality of pixels; a first color filter disposed between the white OLED and the driving circuit unit, the first color filter having a first color; and a second color filter or a third color filter configured to overlap the first color filter between the white OLED and the driving circuit unit, the second color filter having a second color and the third color filter having a third color.

In one embodiment, a light emitting display device comprises a first pixel. The first pixel comprises a first light emitting diode, a first driving circuit to drive the first light emitting diode, and a first color filter corresponding to a first color (e.g. blue, green), the first color filter overlapping with the first light emitting diode. The display device comprises a second color filter corresponding to a second color (e.g., red). The second color filter overlaps with the first color filter between the first light emitting diode and the first driving circuit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows. As used herein, the singular forms "a", "an" and "the" are intended to include the plural forms as well, unless the context clearly indicates otherwise. The terms "first" and "second" are for differentiating one element from the other element, and these elements should not be limited by these terms. It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, an OLED display device according to an embodiment of the present invention will be described in detail with reference to the accompanying drawings.

A configuration of one pixel area configuring the OLED display device according to an embodiment of the present invention is the same as the configuration illustrated in FIG. 1. Thus, the details described above with reference to FIG. 1 are applied to elements of a pixel area according to an embodiment of the present invention.

Figure 4:
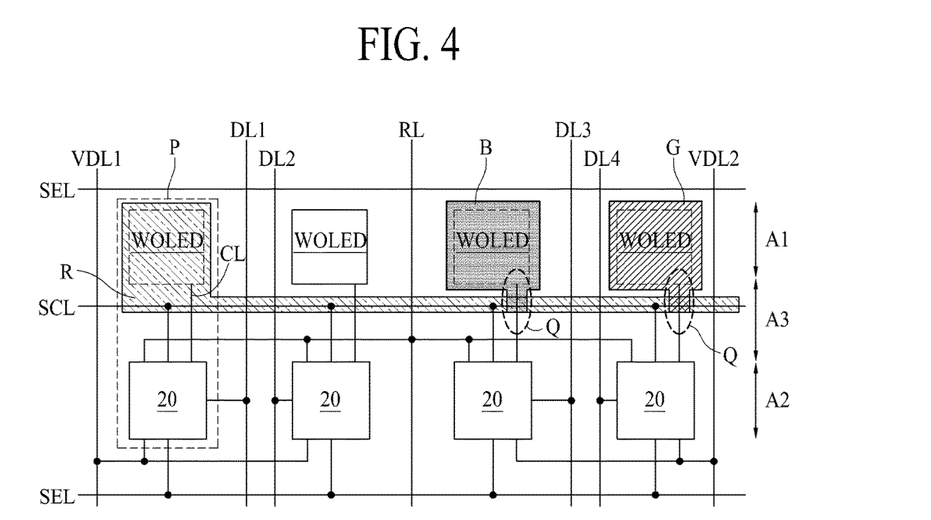
FIG. 4 is a plan view of an OLED display device according to an embodiment of the present invention.

FIG. 4 is a plan view of an OLED display device according to an embodiment of the present invention.

As illustrated in FIG. 4, the OLED display device according to an embodiment of the present invention includes a substrate SUB, a plurality of pixel areas P, a scan line SCL, a sensing line SEL, a reference line RL, a first power line VDL1, and a second power line VDL2.

Each of the pixel areas P may include a white OLED WOLED and a driving circuit unit 20 that drives the white OLED WOLED. The driving circuit unit 20 includes a switching TFT SW_Tr, a driving TFT DR_Tr, a sensing TFT SE_Tr, a capacitor Stg_C, and the white OLED WOLED.

Each of the plurality of pixel areas P may include a first area A1, which is disposed at one side (an upper side) of a corresponding pixel area P with respect to the scan line SCL crossing a space between adjacent sensing lines SEL, and a second area A2 which is disposed at the other side (a lower side). The first area A1 and the second area A2 may be disposed between the adjacent sensing lines SEL. The white OLED WOLED may be disposed in the first area A1, and the driving circuit unit 20 may be disposed in the second area A2.

The plurality of pixel areas P may include a white pixel area P and a plurality of pixel areas P respectively having first to third colors. Here, the first color may be red, the second color may be blue, and the third color may be green. The red pixel area P, the white pixel area P, the blue pixel area P, and the green pixel area P are respectively disposed in order in first to fourth columns. The arrangement of the pixel areas P is merely an embodiment, but the present invention is not limited thereto.

The driving circuit unit 20 of each pixel area P may be connected to the scan line SCL, the sensing line SEL, a data line DL, and a power line VDL which are adjacent thereto. In detail, the power lines VDL1 and VDL2 may be disposed at both sides of the red, white, blue, and green pixel areas P which are respectively disposed in the first to fourth columns. In this case, the driving circuit units 20 of the red and white pixel areas P which are respectively disposed in the first column and the second column may be connected to, in common, the first power line VDL1 which is disposed at one side of the first column, and the driving circuit units 20 of the blue and green pixel areas P which are respectively disposed in the third column and the fourth column may be connected to, in common, the second power line VDL2 which is disposed at one side of the fourth column. Also, the red, white, blue, and green pixel areas P which are respectively disposed in the first to fourth columns may be connected to, in common, the reference line RL which is disposed between the second column and the third column. According to an embodiment of the present invention, by decreasing the numbers of the power lines VDL and reference lines RL which are arranged in a direction of the data line DL, an aperture ratio increases, and the number of channels is reduced, thereby reducing the cost.

The OLED display device according to an embodiment of the present invention may have the COT structure where a plurality of color filters R, G and B are disposed on a lower array substrate.

The plurality of color filters R, G and B may include a red color filter R, a blue color filter B, and a red color filter G.

The red color filter R may overlap the white OLED WOLED which is disposed in the red pixel area P, the blue color filter B may overlap the white OLED WOLED which is disposed in the blue pixel area P, and the green color filter G may overlap the white OLED WOLED which is disposed in the green pixel area P. The red color filter R may be disposed in the third area A3 where the scan line SCL is formed, in addition to the red pixel area P. The red color filter R disposed in the third area A3 prevents light from being leaked from a corresponding pixel area P.

According to an embodiment of the present invention, in the third area A3 between the white OLED WOLED and the driving circuit unit 20, the blue color filter B or the green color filter G may extend to overlap the red color filter R. This is for preventing the connection electrode CL from being broken because the red, green, and blue color filters R, G and B are differently and repeatedly contracted and expanded in a plurality of thermal processes which are subsequent processes performed after a process of depositing a color filter.

Hereinafter, a structure of a pixel area P according to an embodiment of the present invention will be described in detail.

Figure 5:
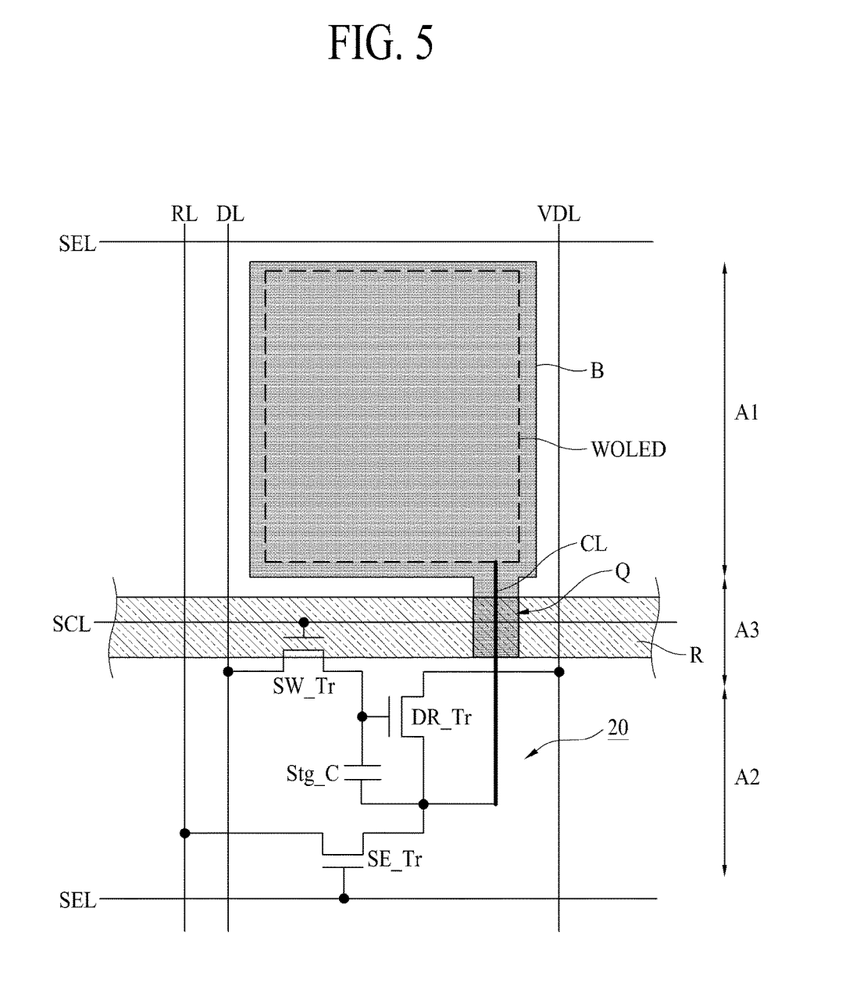
FIG. 5 is a plan view schematically illustrating a blue pixel area of FIG. 4.
Figure 6:
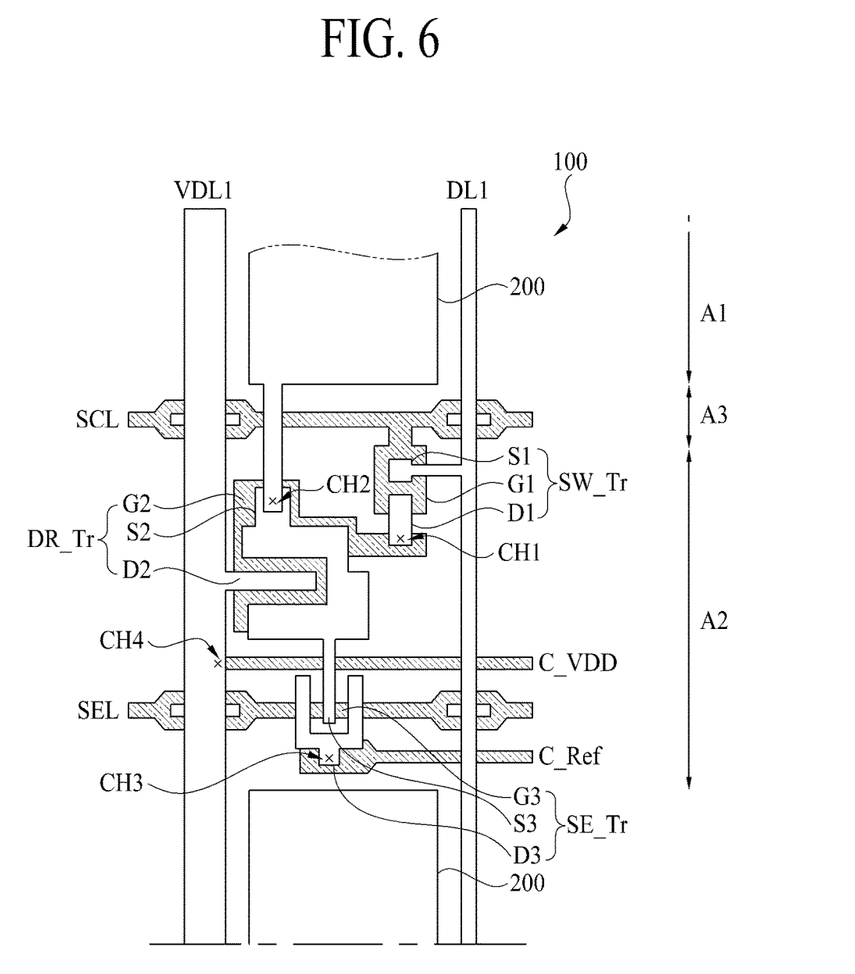
FIG. 6 is a layout illustrating in detail the blue pixel area of FIG. 5.
Figure 7:
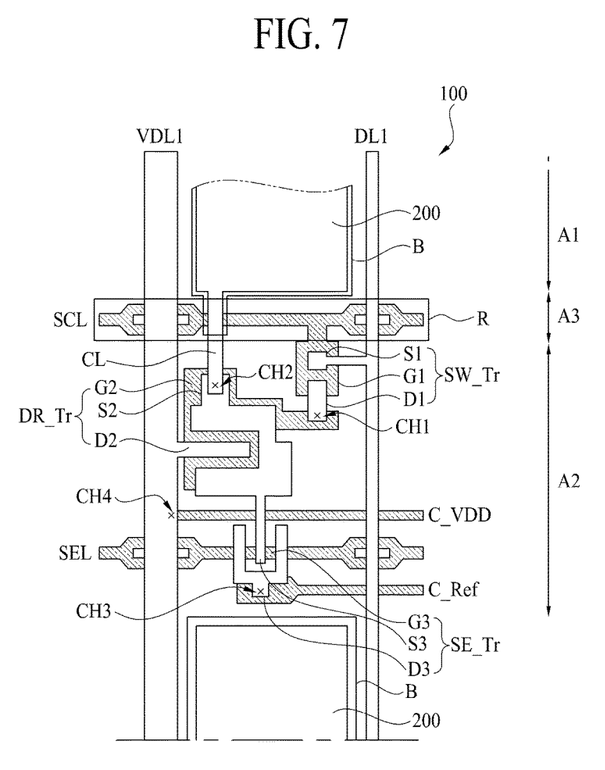
FIG. 7 is a diagram illustrating the layout of FIG. 6 into which a color filter is added.
Figure 8:
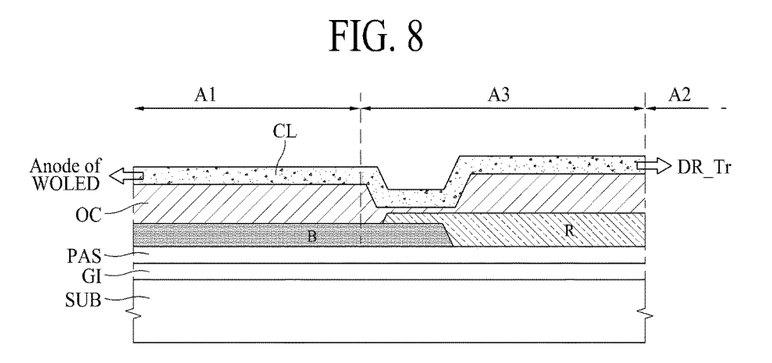
FIG. 8 is a cross-sectional view of an area Q illustrated in FIGS. 4 and 5.

FIG. 5 is a plan view schematically illustrating a blue pixel area of FIG. 4. FIG. 6 is a layout illustrating in detail the blue pixel area of FIG. 5. FIG. 7 is a diagram illustrating the layout of FIG. 6 into which a color filter is added. FIG. 8 is a cross-sectional view of an area Q illustrated in FIGS. 4 and 5 and illustrates the third area A3 where the connection electrode CL is formed in the blue pixel area P. For reference, for convenience of a description, the scan line SCL is not illustrated in FIG. 8.

Referring to FIGS. 5 and 6, each pixel area P may be divided into the first and second areas A1 and A2 with respect to the scan line SCL. In the blue pixel area P, the white OLED WOLED may be disposed in the first area A1, and the driving circuit unit 20 may be disposed in the second area A2.

The scan line SCL and the sensing line SEL may be disposed in a first direction near each pixel area P, and the first power line VDL1 and a first data line DL1 may be disposed in a second direction perpendicular to the first direction. The scan line SCL and sensing line SEL intersect with the first power line VDL1 and the first data lie DL1

Each of the scan line SCL and the sensing line SEL may include a hole which is provided in an area intersecting the first power line VDL1 and the first data line DL1. The hole decreases an overlapping area in the intersecting area, thereby reducing signal interference between lines.

The switching TFT SW_Tr may include a first gate electrode G1, a first source electrode S1, and a first drain electrode D1. The switching TFT SW_Tr may further include an upper gate electrode and thus may have a double gate structure.

The first gate electrode G1 may have a structure which branches from the scan line SCL, but is not limited thereto. A portion of the scan line SCL may function as the gate electrode G1. The first source electrode S1 may have a structure which branches from the first data line DL1. The first drain electrode D1 may face the first source electrode S1. The first drain electrode D1 may be connected to a second gate electrode G2 of the driving TFT DR_Tr through a contact hole CH1. Although not shown, the switching TFT SW_Tr may further include an active layer which is connected to the first source electrode S1 and the first drain electrode D1 and acts as an electron transfer channel.

The driving TFT DR_Tr may include a second gate electrode G2, a second source electrode S2, and a second drain electrode D2. The driving TFT DR_Tr may further include an upper gate electrode and thus may have a double gate structure.

The second gate electrode G2, as described above, may be connected to the first drain electrode D1 of the switching TFT SW_Tr through a first contact hole CH1. The second drain electrode D2 may have a structure which branches from the first power line VDL1. The second source electrode S2 may face the second drain electrode D2. The second source electrode S2 may function as a below-described third source electrode S3 of the sensing TFT SE_Tr. Also, the second source electrode S2 may be connected to an anode 200 of the white OLED WOLED through the connection electrode CL connected to a second contact hole CH2. Although not shown, the driving TFT DR_Tr may further include an active layer which is connected to the second source electrode S2 and the second drain electrode D2 and acts as an electron transfer channel.

The second gate electrode G2 may overlap the second source electrode S2 to configure the capacitor Stg_C.

The sensing TFT SE_Tr may include a third gate electrode G3, a third source electrode S3, and a third drain electrode D3. The sensing TFT SE_Tr may further include an upper gate electrode and thus may have a double gate structure.

The third gate electrode G3 may be configured with a portion of the sensing line SL, but is not limited thereto. The third gate electrode G3 may have a structure which branches from the sensing line SEL. The third source electrode S3, as described above, may be configured with the second source electrode S2 of the driving TFT DR_Tr. The third drain electrode D3 may face the third source electrode S3 and may be connected to a reference connection line C_Ref through a third contact hole CH3. The reference connection line C_Ref may be arranged in the first direction and may be connected to the reference line RL. Therefore, the third drain electrode D3 may be connected to the reference line RL via the reference connection line C_Ref. Although not shown, the sensing TFT SE_Tr may further include an active layer which is connected to the third source electrode S3 and the third drain electrode D3 and acts as an electron transfer channel.

The anode 200 of the white OLED WOLED, as described above, may be connected to the second source electrode S2 of the driving TFT DR_Tr through the connection electrode CL connected to the second contact hole CH2.

In FIG. 6, reference label "C_VDD" (not described) refers to a power connection line and refers to a line that connects the first power line VDL1 to a drain electrode of a driving TFT of an adjacent pixel. Therefore, one end of the power connection line C_VDD may be connected to the first power line VDL1 through a fourth contact hole CH4, and the other end of the power connection line C_VDD may be connected to the drain electrode of the driving TFT of the adjacent pixel through a separate contact hole.

As illustrated in FIGS. 5 and 7, in the blue or green pixel area P, the blue or green color filter B or G may be disposed in the first area A1. For example, the blue color filter B may be disposed in the first area A1, may extend to the third area A3 between the blue pixel area P and the driving circuit unit 20, and may overlap the red color filter R. Although not shown, in the green pixel area P, the green color filter G may extend to the third area A3 and overlap the red color filter R.

An extension portion of each of the blue and green color filters B and G, as illustrated in FIG. 8, may overlap the red color filter R, and moreover, may overlap the connection electrode CL which connects the driving TFT DR_Tr of the driving circuit unit 20 to the white OLED WOLED. Therefore, since the color filters which overlap each other are disposed under the connection electrode CL, the connection electrode CL is prevented from being broken by contraction and expansion of the color filters, thereby preventing a dark spot from occurring in each pixel.

According to the embodiments of the present invention, since the color filters which overlap each other are disposed under the connection electrode which connects the white OLED to the driving circuit unit, the connection electrode is prevented from being broken by contraction and expansion of the color filters, thereby preventing a dark spot from occurring in each pixel.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device comprising:
 a plurality of pixels disposed on a substrate;
 a white OLED disposed in each of the plurality of pixels;
 a driving circuit unit disposed in each of the plurality of pixels;
 a first color filter disposed between the white OLED and the driving circuit unit, the first color filter having a first color;
 a second color filter or a third color filter overlapping the first color filter between the white OLED of a respective pixel of the plurality of pixels and the driving circuit unit of the respective pixel of the plurality of pixels, the second color filter having a second color and the third color filter having a third color,
 wherein a first portion of the first color filter in the respective pixel is overlapped with the second color filter or the third color filter in an area between the white OLED and the driving circuit unit, a second portion of the first color filter in the respective pixel is not overlapped with the second color filter or the third color filter, and the second portion of the first color filter in the respective pixel that is not overlapped with the second color filter or the third color filter is between the white OLED and the driving circuit unit in a plan view of the OLED display device; and
 a connection electrode connecting the white OLED to a driving thin film transistor included in the driving circuit unit, wherein the connection electrode is disposed on a region in which the second color filter or the third color filter overlap the first color filter.

2. The OLED display device of claim 1, wherein
 the plurality of pixels comprise a white color pixel, a first-color pixel, a second-color pixel, and a third-color pixel,
 the first color filter having the first color is disposed in the first-color pixel,
 the second color filter having the second color is disposed in the second-color pixel, and
 the third color filter having the third color is disposed in the third-color pixel,
 wherein the first color filter disposed between the white OLED and the driving circuit unit prevents light from being leaked from a corresponding pixel.

3. The OLED display device of claim 2, wherein
 the first color is red,
 the second color is blue, and
 the third color is green.

4. The OLED display device of claim 3, wherein
 the red, white, blue, and green pixels are respectively disposed in order in first to fourth columns,
 the red pixel and the white pixel are connected to, in common, a first power line which is disposed at one side of the first column, and
 the blue pixel and the green pixel are connected to, in common, a second power line which is disposed at one side of the fourth column.

5. The OLED display device of claim 4, wherein the red, white, blue, and green pixels are connected to, in common, a reference line which is disposed between the second column and the third column.

6. The OLED display device of claim 1, wherein a portion of the second color filter or the third color filter extends from a side of the second color filter or the third color filter to overlap with the first color filter in the area between the white OLED and the driving circuit unit.

7. A light emitting display device comprising:
 a first pixel comprising:
  a first light emitting diode;
  a first driving circuit to drive the first light emitting diode, wherein the first driving circuit comprises a driving thin film transistor;

a first color filter corresponding to a first color, the first color filter overlapping with the first light emitting diode;

a second color filter corresponding to a second color, the second color filter overlapping with the first color filter between the first light emitting diode and the first driving circuit, wherein a first portion of the second color filter in the first pixel is overlapped with the first color filter in an area between the first light emitting diode and the first driving circuit, a second portion of the second color filter in the first pixel is not overlapped with the first color filter, and the second portion of the second color filter in the first pixel that is not overlapped with the first color filter is between the first light emitting diode and the first driving circuit in a plan view of the light emitting display device; and a connection electrode connecting the first light emitting diode to the driving thin film transistor, wherein the first color filter and the second color filter overlap in an overlapping region and the connection electrode is disposed on the overlapping region.

8. The light emitting display device of claim 7, wherein the second color filter disposed between the first light emitting diode and the first driving circuit prevents light from being leaked from a corresponding pixel.

9. The light emitting display device of claim 7, further comprising:
a second pixel comprising:
a second light emitting diode;
a second driving circuit to drive the second light emitting diode; and
the second color filter, the second color filter overlapping with the second light emitting diode.

10. The light emitting display device of claim 9, further comprising:
a third pixel comprising:
a third light emitting diode;
a third driving circuit to drive the third light emitting diode; and a third color filter corresponding to a third color, the third color filter overlapping with the first light emitting diode, wherein the second color filter overlaps with the third color filter between the third light emitting diode and the third driving circuit.

11. The light emitting display device of claim 10, wherein the first pixel is a blue pixel and the first color is blue,
the second pixel is a red pixel and the second color is red, and
the third pixel is a green pixel and the third color is green.

12. The light emitting display device of claim 11, further comprising:
a white pixel, and wherein:
the red pixel, the white pixel, the blue pixel and the green pixel are disposed respectively in order in first to fourth columns,
the red and white pixels are connected to, in common, a first power line which is disposed at one side of the first column, and
the blue and green pixels are connected to, in common, a second power line which is disposed at one side of the fourth column.

13. The light emitting display device of claim 12, wherein the red, white, blue and green pixels are connected to, in common, a reference line which is disposed between the second column and the third column.

14. The light emitting display device of claim 10, wherein the first light emitting diode, second light emitting diode, and third light emitting diode are white light emitting diodes.

15. The light emitting display device of claim 10, wherein the first light emitting diode, second light emitting diode, and third light emitting diode are organic light emitting diodes.

16. The light emitting display device of claim 7, wherein a portion of the first color filter extends from a side of the first color filter to overlap with the second color filter in the area between the first light emitting diode and the first driving circuit.

* * * * *